United States Patent
Ma et al.

(10) Patent No.: US 9,479,368 B2
(45) Date of Patent: Oct. 25, 2016

(54) METHOD AND APPARATUS FOR ADJUSTING PRE-DISTORTION COEFFICIENT

(71) Applicant: Huawei Technologies Co., Ltd., Shenzhen (CN)

(72) Inventors: Xinyue Ma, Shenzhen (CN); Wei Xue, Chengdu (CN); Tianxiang Wang, Chengdu (CN); Xiangdong Deng, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 36 days.

(21) Appl. No.: 14/288,151

(22) Filed: May 27, 2014

(65) Prior Publication Data

US 2014/0269973 A1    Sep. 18, 2014

Related U.S. Application Data

(63) Continuation of application No. PCT/CN2011/083034, filed on Nov. 28, 2011.

(51) Int. Cl.
*H04B 3/20* (2006.01)
*H04B 3/36* (2006.01)
(Continued)

(52) U.S. Cl.
CPC ............. *H04L 25/08* (2013.01); *H03F 1/3247* (2013.01); *H03F 1/3258* (2013.01); *H03F 3/195* (2013.01); *H03F 3/245* (2013.01); *H04B 1/0475* (2013.01); *H04B 3/23* (2013.01); *H04L 27/368* (2013.01); *H04B 2001/0425* (2013.01)

(58) Field of Classification Search
CPC . H04L 1/203; H04L 25/03885; H04L 27/01; H04L 5/006; H04L 27/2647; H04L 25/0292; H04L 1/0668
USPC ............................................. 370/290; 381/66
See application file for complete search history.

(56) References Cited

U.S. PATENT DOCUMENTS

| | | | | |
|---|---|---|---|---|
| 4,564,934 A | * | 1/1986 | Macchi | H04B 3/23 370/290 |
| 4,947,354 A | * | 8/1990 | Hethuin | G01S 13/343 342/122 |

(Continued)

FOREIGN PATENT DOCUMENTS

| | | |
|---|---|---|
| CN | 1335699 A | 2/2002 |
| CN | 101238638 A | 8/2008 |

(Continued)

*Primary Examiner* — Daniel Washburn
*Assistant Examiner* — Sarah Hassan
(74) *Attorney, Agent, or Firm* — Slater Matsil, LLP

(57) ABSTRACT

A pre-distortion coefficient corresponding to a transmit power currently set by a transmitting end is adjusted. A signal received quality report which is obtained according to the pre-distortion coefficient before adjustment is analyzed and fed back by a receiving end and a signal received quality report that is obtained according to the pre-distortion coefficient after adjustment and fed back by the receiving end. The analysis determines a variation situation of signal received quality of the receiving end. If the signal received quality of the receiving end becomes better, the pre-distortion coefficient after adjustment is used as the pre-distortion coefficient corresponding to the transmit power currently set by the transmitting end. The process then returns to the step of adjusting a pre-distortion coefficient corresponding to a transmit power currently set by a transmitting end.

16 Claims, 7 Drawing Sheets

(51) Int. Cl.
  *H04L 25/08* (2006.01)
  *H04B 3/23* (2006.01)
  *H03F 1/32* (2006.01)
  *H03F 3/24* (2006.01)
  *H03F 3/195* (2006.01)
  *H04L 27/36* (2006.01)
  *H04B 1/04* (2006.01)

(56) References Cited

U.S. PATENT DOCUMENTS

| | | | | |
|---|---|---|---|---|
| 5,093,801 | A * | 3/1992 | White | G06F 17/142 708/404 |
| 8,023,588 | B1 * | 9/2011 | Benson | H04L 25/03343 330/147 |
| 2002/0041678 | A1 * | 4/2002 | Basurg-Ertem | H04B 3/23 379/406.01 |
| 2003/0012388 | A1 * | 1/2003 | Ura | H04R 3/02 381/66 |
| 2003/0104794 | A1 | 6/2003 | Yang et al. | |
| 2004/0021517 | A1 * | 2/2004 | Irvine | H03F 1/3282 330/151 |
| 2007/0008033 | A1 * | 1/2007 | Okazaki | H03F 1/32 330/149 |
| 2007/0030065 | A1 * | 2/2007 | Heinikoski et al. | 330/149 |
| 2008/0051042 | A1 | 2/2008 | Komaili et al. | |
| 2009/0256630 | A1 | 10/2009 | Brobston | |
| 2010/0156530 | A1 * | 6/2010 | Utsunomiya et al. | 330/149 |
| 2010/0283540 | A1 * | 11/2010 | Davies | H03F 1/3247 330/149 |
| 2011/0075745 | A1 | 3/2011 | Kleider et al. | |

FOREIGN PATENT DOCUMENTS

| | | |
|---|---|---|
| CN | 101459647 A | 6/2009 |
| CN | 101626355 A | 1/2010 |
| CN | 101753105 A | 6/2010 |
| CN | 101771383 A | 7/2010 |

* cited by examiner

METHOD AND APPARATUS FOR ADJUSTING PRE-DISTORTION COEFFICIENT

This application is a continuation of International Application No. PCT/CN2011/083034, filed on Nov. 28, 2011, which is hereby incorporated by reference in its entirety.

TECHNICAL FIELD

The present invention relates to the field of mobile communications and, in particular embodiments, to a method and an apparatus for adjusting a pre-distortion coefficient.

BACKGROUND

In wireless communications, a non-linearity problem of a PA (power amplifier) restricts a maximum transmit power and efficiency of the PA. In order to improve the transmit power and efficiency of the PA to a maximum extent, a pre-distortion technology may be adopted to offset non-linearity of the PA, so as to enable the PA to work in a non-linear amplification region, thereby improving the transmit power and efficiency of the PA. The pre-distortion technology refers to that, pre-distortion processing is performed for a signal before the signal is input to a PA, to obtain a distorted signal, and the distorted signal will offset non-linearity of the PA when passing through the PA, thereby implementing linearity of the PA and improving a transmit power and efficiency of the PA.

In the pre-distortion technology, a pre-distortion coefficient plays a key role. An optimal linear effect of the PA can be achieved by selecting a pre-distortion coefficient which best matches a current output power of the PA. Currently. The pre-distortion coefficient mainly includes two types, namely, an open-loop pre-distortion coefficient and a closed-loop pre-distortion coefficient.

Regarding the open-loop pre-distortion coefficient, outputs under different transmit powers in a non-linearity region of a PA are sampled by using a dedicated instrument (for example, a spectrum analyzer) before a device (for example, a transceiver) leaves the factory, a group of pre-distortion coefficients corresponding to the transmit powers of the PA is obtained by using a computer, and the group of pre-distortion coefficients is written into a memory of the device. When the device is in actual use, a pre-distortion coefficient corresponding to a transmit power currently set by the device is directly selected from the memory to perform pre-distortion processing for a signal, so as to solve a non-linearity problem of the PA. However, with temperature variations and PA aging, an actual transmit power of the device may deviate from the currently set transmit power, which causes deviation of a correspondence between the set transmit power and an open-loop pre-distortion coefficient, making a pre-distortion effect poor.

Different from the open-loop pre-distortion coefficient, regarding the closed-loop pre-distortion coefficient, a pre-distortion coefficient calculating apparatus (mainly including a sampling circuit, a frequency converter, a filter, an analog to digital converter, and the like) is integrated on a device (for example, a transceiver), and the calculating apparatus is used to sample outputs of the PA in real time, so as to calculate a pre-distortion coefficient which best matches a current transmit power, thereby achieving an optimal pre-distortion effect. However, in this manner, the pre-distortion coefficient calculating apparatus such as the sampling circuit, the frequency converter, the filter, and the analog to digital converter needs to be added to each device, which significantly increases a manufacturing cost.

SUMMARY

Embodiments of the present invention provide a method and an apparatus for adjusting a pre-distortion coefficient, which can overcome problems that a pre-distortion effect is affected by temperature and PA aging when an open-loop pre-distortion coefficient is adopted, and that a high cost is caused when a closed-loop pre-distortion coefficient is adopted.

In order to solve the foregoing technical problems, an embodiment of the present invention provides a method for adjusting a pre-distortion coefficient. A pre-distortion coefficient corresponding to a transmit power currently set by a transmitting end is adjusted. A signal received quality report which is obtained according to the pre-distortion coefficient before adjustment is analyzed and fed back by a receiving end and a signal received quality report that is obtained according to the pre-distortion coefficient after adjustment and fed back by the receiving end. The analysis determines a variation situation of signal received quality of the receiving end. If the signal received quality of the receiving end becomes better, the pre-distortion coefficient after adjustment is used as the pre-distortion coefficient corresponding to the transmit power currently set by the transmitting end. The process then returns to the step of adjusting a pre-distortion coefficient corresponding to a transmit power currently set by a transmitting end. If the signal received quality of the receiving end becomes worse, the pre-distortion coefficient before adjustment is used as the pre-distortion coefficient corresponding to the transmit power currently set by the transmitting end.

Correspondingly, an embodiment of the present invention further provides an apparatus for adjusting a pre-distortion coefficient. A first adjusting module is configured to adjust a pre-distortion coefficient corresponding to a transmit power currently set by a transmitting end. A first analyzing module is configured to analyze a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end. A first instructing module is configured to, when the signal received quality of the receiving end becomes better, use the pre-distortion coefficient after adjustment as the pre-distortion coefficient corresponding to the transmit power currently set by the transmitting end, and then instruct the first adjusting module to adjust the pre-distortion coefficient corresponding to the transmit power currently set by the transmitting end. An executing module, configured to, when the signal received quality of the receiving end becomes worse, use the pre-distortion coefficient before adjustment as the pre-distortion coefficient corresponding to the transmit power currently set by the transmitting end.

The embodiments of the present invention have beneficial effects.

In the embodiments of the present invention, a pre-distortion coefficient corresponding to a currently set transmit power is adjusted; a signal received quality report before adjustment and a signal received quality report after adjustment which are fed back by a receiving end are analyzed, to determine a variation situation of signal received quality of the receiving end; and it is determined according to the variation situation whether to continue to adjust the pre-distortion coefficient corresponding to the currently set transmit power. Because the variation situation of the signal received quality of the receiving end is used as a basis for measuring whether to continue to adjust the pre-distortion coefficient, the pre-distortion coefficient corresponding to the currently set transmit power can be adjusted to match the current actual transmit power, so as to obtain a better pre-distortion effect, thereby overcoming problems that the pre-distortion effect is affected by temperature and PA aging when an open-loop pre-distortion coefficient is adopted, and that a high cost is caused when a closed-loop pre-distortion coefficient is adopted.

BRIEF DESCRIPTION OF THE DRAWINGS

To describe the technical solutions in the embodiments of the present invention or in the prior art more clearly, the following briefly introduces accompanying drawings required for describing the embodiments or the prior art. Apparently, the accompanying drawings in the following description show merely some embodiments of the present invention, and a person of ordinary skill in the art may still derive other drawings according to these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the embodiments to be described are merely a part rather than all of the embodiments of the present invention. All other embodiments obtained by a person of ordinary skill in the art based on the embodiments of the present invention without creative efforts shall fall within the protection scope of the present invention.

Figure 1:
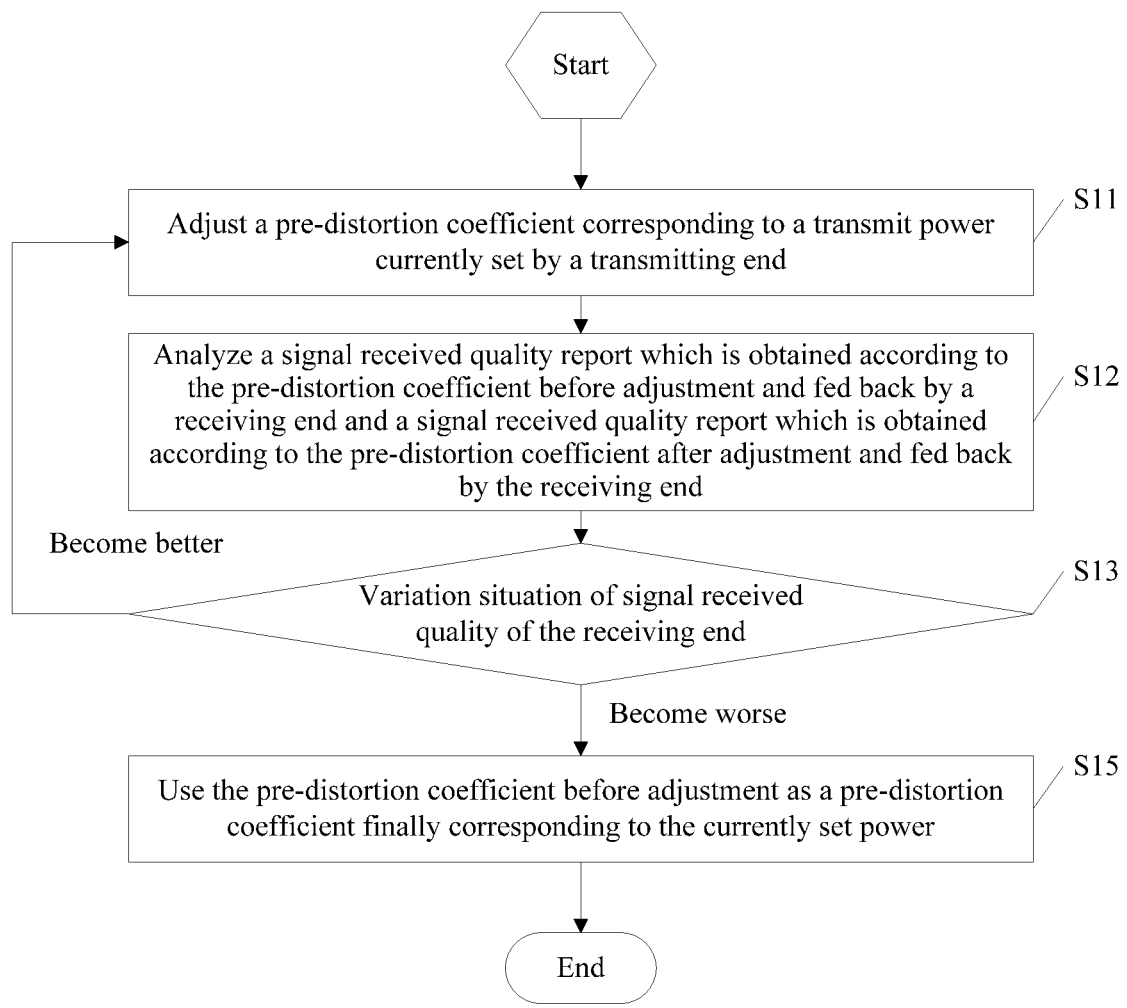
FIG. 1 is a schematic flowchart of a first embodiment of a method for adjusting a pre-distortion coefficient according to the present invention.

FIG. 1 is a schematic flowchart of a first embodiment of a method for adjusting a pre-distortion coefficient according to the present invention. The method includes the following steps.

Step S11: Adjust a pre-distortion coefficient corresponding to a transmit power currently set by a transmitting end.

Specifically, adjusting the pre-distortion coefficient corresponding to a transmit power currently set by a transmitting end may include adjusting the pre-distortion coefficient corresponding to the transmit power currently set by the transmitting end to be a pre-distortion coefficient corresponding to the transmit power which is assumed to be increased by N adjustment steps. N is the assumed number of increase times of the transmit power. Alternatively, adjusting the pre-distortion coefficient may include adjusting the pre-distortion coefficient corresponding to the transmit power currently set by the transmitting end to be a pre-distortion coefficient corresponding to the transmit power which is assumed to be decreased by N adjustment steps, where N is the assumed number of decrease times of the transmit power.

For example, the transmit power currently set by the transmitting end is X and the adjustment step is $\Delta x$. Then, during the adjustment, a pre-distortion coefficient corresponding to a transmit power with a value of $(X \pm N^*\Delta x)$ is used as the pre-distortion coefficient corresponding to the currently set transmit power X, namely, the pre-distortion coefficient after adjustment. N is the assumed number of increase or decrease times of the transmit power. Here, it should be noted that in this embodiment, only a pre-distortion coefficient corresponding to a transmit power which is obtained after the currently set transmit power is assumed to be increased or decreased by an adjustment value is used as the pre-distortion coefficient corresponding to the currently set transmit power, but the currently set transmit power is actually not changed.

It should be noted that, because of influences of factors such as temperature variations and aging of a component (mainly a PA), there may be a certain degree of deviation between the transmit power currently set by the transmitting end and a current actual transmit power of the transmitting end.

It is understandable that the pre-distortion coefficient corresponding to the currently set transmit power may be a digital pre-distortion coefficient, and further, an open-loop pre-distortion coefficient.

Step S12: Analyze a signal received quality report which is obtained according to the pre-distortion coefficient before adjustment and fed back by a receiving end and a signal received quality report which is obtained according to the pre-distortion coefficient after adjustment and fed back by the receiving end.

The signal received quality report which is obtained according to the pre-distortion coefficient before adjustment and fed back by the receiving end may be obtained by adopting the following manners before step S11.

A: Perform pre-distortion processing for a baseband signal by using the pre-distortion coefficient before adjustment, to generate a pre-distorted baseband signal.

B: Perform a series of processing (mainly including modulation and up-conversion) for the pre-distorted baseband signal which is generated according to the pre-distortion coefficient before adjustment, transmit the processed signal to the receiving end, and receive the signal received quality report fed back by the receiving end.

Similarly, the signal received quality report which is obtained according to the pre-distortion coefficient after adjustment and fed back by the receiving end may be obtained by adopting the following manners after step S11.

C: Perform pre-distortion processing for a baseband signal by using the pre-distortion coefficient after adjustment, to generate a pre-distorted baseband signal.

D: Perform a series of processing (mainly including modulation and up-conversion) for the pre-distorted baseband signal which is generated according to the pre-distortion coefficient after adjustment, transmit the processed signal to the receiving end, and receive the signal received quality report fed back by the receiving end.

Further, both the signal received quality report which is obtained according to the pre-distortion coefficient before adjustment and the signal received quality report which is obtained according to the pre-distortion coefficient after adjustment may include a physical quantity for measuring signal received quality of the receiving end, for example, an MSE (Mean Squared Error) value or an SNR (signal to noise ratio). A variation situation of the signal received quality of the receiving end may be obtained by comparing the MSE values or SNRs in the signal received quality report obtained in two times. According to the variation situation of signal received quality of the receiving end, it may be determined in a reverse manner, for the transmit power currently set by the transmitting end, whether a better pre-distortion effect can be achieved by adopting the pre-distortion coefficient before adjustment or by adopting the pre-distortion coefficient after adjustment.

Step S13: Determine a variation situation of signal received quality of the receiving end. Here, the variation situation of the signal received quality includes that: the signal received quality of the receiving end becomes better, or the signal received quality of the receiving end becomes worse. When the signal received quality becomes better, execute step S14; and when the signal received quality becomes worse, execute step S15.

Step S14: Use the pre-distortion coefficient after adjustment as the pre-distortion coefficient corresponding to the transmit power currently set by the transmitting end, and then return to execute step S11.

Step S15: Use the pre-distortion coefficient before adjustment as the pre-distortion coefficient corresponding to the transmit power currently set by the transmitting end.

Further, in step S15 of using the pre-distortion coefficient before adjustment as the pre-distortion coefficient corresponding to the transmit power currently set by the transmitting end, a correspondence is established between a current temperature and the pre-distortion coefficient finally corresponding to the transmit power currently set by the transmitting end. For example, a pre-distortion coefficient LUT (Look-Up-Table, look-up-table) table is established, and a one-to-one correspondence among the transmit power (the set transmit power, which may deviate from an actual transmit power), the pre-distortion coefficient, and the temperature is recorded in the LUT table. Alternatively, the one-to-one correspondence among the transmit power, the pre-distortion coefficient and the temperature may be written into an existing LUT table. By recording the relationship between the pre-distortion coefficient and the temperature, repeated adjustment of the pre-distortion coefficient under a same temperature can be avoided.

It is understandable that conditions for triggering execution of the method for adjusting a pre-distortion coefficient in this embodiment may include the following: A power-on signal is detected. When the power-on signal is detected, a most possible case is that a working environment is changed, and the pre-distortion coefficient is adjusted to adapt to the environmental variation; or, it is detected that a current environmental temperature is not in a preset temperature range. For example, the preset temperature range is [15°, 30°], but the detected current temperature is 0°; or, the signal received quality of the receiving end does not meet an expected requirement. In this case, in order to ensure the signal received quality of the receiving end, an attempt may be made to adjust the pre-distortion coefficient corresponding to the currently set transmit power; or, when a set moment of a timer arrives, for example, the pre-distortion coefficient corresponding to the currently set power may be adjusted seasonally by using the timer; or, there is another reasonable opportunity.

In this embodiment, a pre-distortion coefficient corresponding to a transmit power currently set by a transmitting end is adjusted, and whether to continue adjustment is determined according to a variation situation of signal received quality of a receiving end before or after the adjustment, so as to find a pre-distortion coefficient which can better match a current actual transmit power as the pre-distortion coefficient corresponding to the transmit power currently set by the transmitting end, thereby overcoming influences of temperature variations (also called "temperature drift") and aging of a component (mainly a PA) on a pre-distortion effect. In addition, because the method for adjusting a pre-distortion coefficient in this embodiment does not need to add a component such as a sampling circuit, a frequency converter, a filter, or an analog to digital converter for implementing a closed-loop pre-distortion coefficient, and can be directly implemented by software, a manufacturing cost can be reduced significantly.

Figure 2:
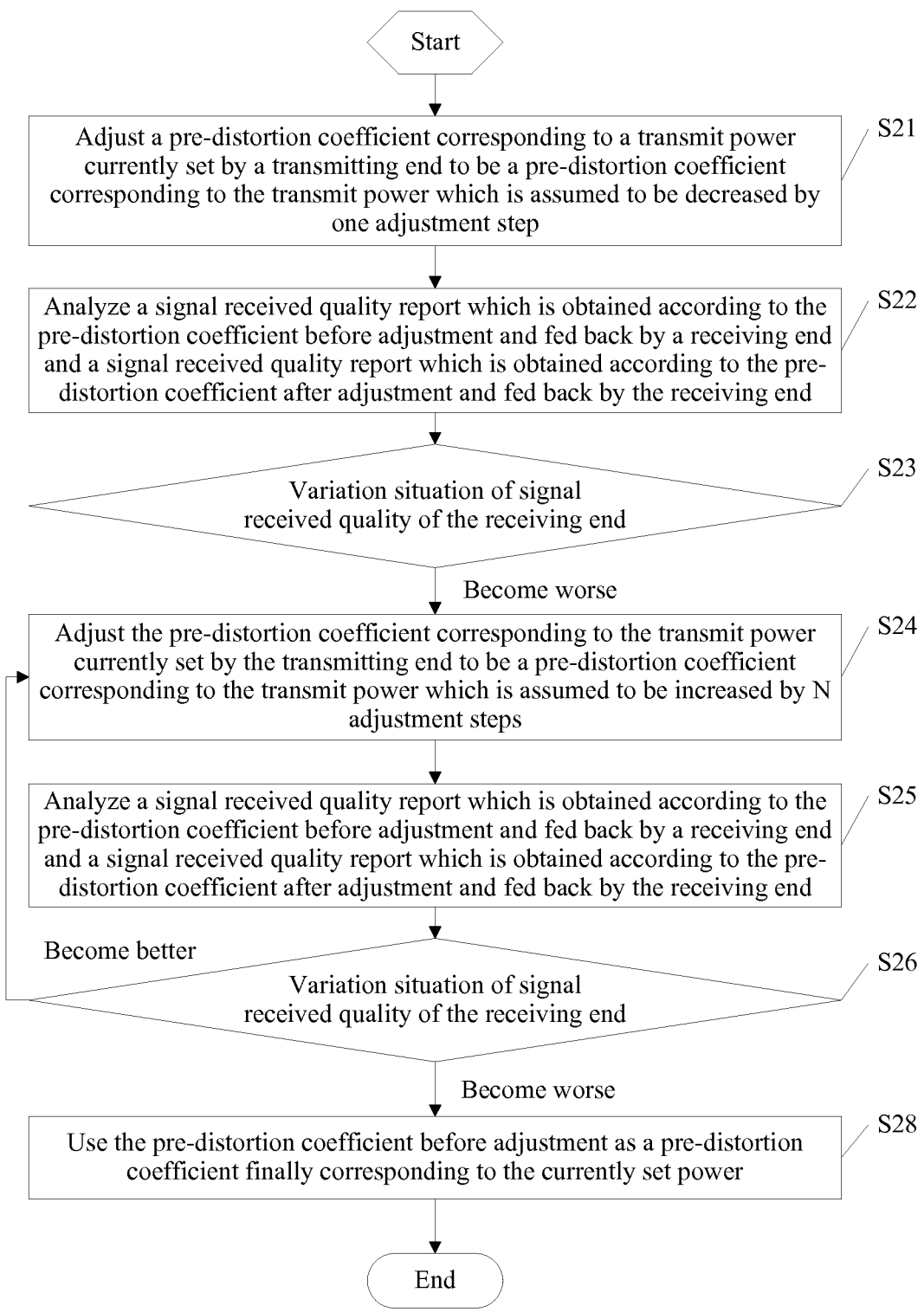
FIG. 2 is a schematic flowchart of a second embodiment of a method for adjusting a pre-distortion coefficient according to the present invention.

FIG. 2 is a schematic flowchart of a second embodiment of a method for adjusting a pre-distortion coefficient according to the present invention, where the method includes:

Step S21: Adjust a pre-distortion coefficient corresponding to a transmit power currently set by a transmitting end to be a pre-distortion coefficient corresponding to the transmit power which is assumed to be decreased by one adjustment step.

Here, it is assumed that the transmit power currently set by the transmitting end is X and the adjustment step is $\Delta x$; then, the pre-distortion coefficient corresponding to the currently set transmit power X is adjusted to be a pre-distortion coefficient corresponding to a set transmit power $(X-\Delta x)$.

Step S22: Analyze a signal received quality report which is obtained according to the pre-distortion coefficient before adjustment and fed back by a receiving end and a signal received quality report which is obtained according to the pre-distortion coefficient after adjustment and fed back by the receiving end.

Step S23: Determine a variation situation of signal received quality of the receiving end. If the signal received quality of the receiving end becomes worse, use the pre-distortion coefficient before adjustment as the pre-distortion coefficient corresponding to the currently set transmit power, and then turn to step S24.

Step S24: Adjust the pre-distortion coefficient corresponding to the transmit power currently set by the transmitting end to be a pre-distortion coefficient corresponding to the transmit power which is assumed to be increased by N adjustment steps.

Here, it is assumed that the transmit power currently set by the transmitting end is X and the adjustment step is Δx; then, a pre-distortion coefficient corresponding to the currently set transmit power X is adjusted to be a pre-distortion coefficient corresponding to the set transmit power which is assumed to be (X+N*Δx), where N is the assumed number of increase times of the transmit power. For example, when the process turns to step S24 from step S23, N=1. Here, it should be noted that in step S24, the pre-distortion coefficient corresponding to (X+N*Δx) is only used as the pre-distortion coefficient corresponding to the currently set transmit power X, to implement adjustment of the pre-distortion coefficient corresponding to the currently set transmit power X, but the currently set transmit power is not changed.

Step S25: Analyze a signal received quality report which is obtained according to the pre-distortion coefficient before adjustment and fed back by a receiving end and a signal received quality report which is obtained according to the pre-distortion coefficient after adjustment and fed back by the receiving end.

Step S26: Determine a variation situation of signal received quality of the receiving end.

Here, the variation situation of the signal received quality includes that: the signal received quality of the receiving end becomes better, or the signal received quality of the receiving end becomes worse. When the signal received quality becomes better, execute step S27; and when the signal received quality becomes worse, execute step S28.

Step S27: Use the pre-distortion coefficient after adjustment as the pre-distortion coefficient corresponding to the transmit power currently set by the transmitting end, and then return to execute step S24.

Step S28: Use the pre-distortion coefficient before adjustment as the pre-distortion coefficient corresponding to the transmit power currently set by the transmitting end.

In this embodiment, when a pre-distortion coefficient corresponding to a transmit power currently set by a transmitting end is adjusted to be a pre-distortion coefficient corresponding to the transmit power which is assumed to be decreased by one adjustment step, and if received signal quality of a receiving end becomes worse, it indicates that a current actual transmit power is higher than the currently set transmit power. Therefore, it is necessary to adjust the pre-distortion coefficient in the manner of adjusting the pre-distortion coefficient corresponding to the transmit power currently set by the transmitting end to be a pre-distortion coefficient corresponding to the transmit power which is assumed to be increased by N adjustment steps.

Figure 3:
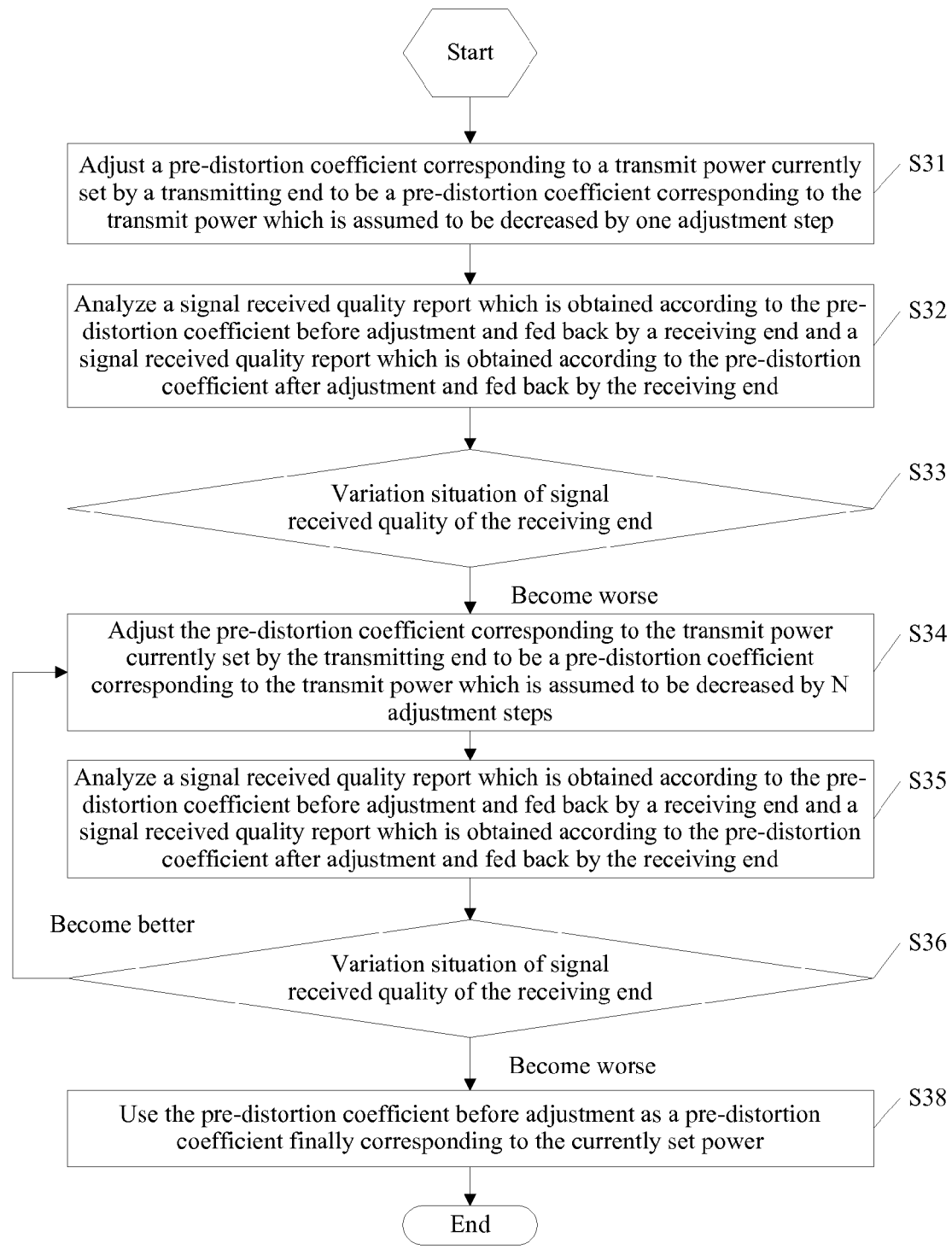
FIG. 3 is a schematic flowchart of a third embodiment of a method for adjusting a pre-distortion coefficient according to the present invention.

FIG. 3 is a schematic flowchart of a third embodiment of a method for adjusting a pre-distortion coefficient according to the present invention. The method includes the following steps.

Step S31: Adjust a pre-distortion coefficient corresponding to a transmit power currently set by a transmitting end to be a pre-distortion coefficient corresponding to the transmit power which is assumed to be increased by one adjustment step.

Here, it is assumed that the transmit power currently set by the transmitting end is X and the adjustment step is Δx. Then, the pre-distortion coefficient corresponding to the currently set transmit power X is adjusted to be a pre-distortion coefficient corresponding to a set transmit power which is assumed to be (X+Δx).

Step S32: Analyze a signal received quality report which is obtained according to the pre-distortion coefficient before adjustment and fed back by a receiving end and a signal received quality report which is obtained according to the pre-distortion coefficient after adjustment and fed back by the receiving end.

Step S33: Determine a variation situation of signal received quality of the receiving end. If the signal received quality of the receiving end becomes worse, use the pre-distortion coefficient before adjustment as the pre-distortion coefficient corresponding to the currently set transmit power, and then turn to step S34.

Step S34: Adjust the pre-distortion coefficient corresponding to the transmit power currently set by the transmitting end to be a pre-distortion coefficient corresponding to the transmit power which is assumed to be decreased by N adjustment steps.

Here, it is assumed that the transmit power currently set by the transmitting end is X and the adjustment step is Δx. Then, a pre-distortion coefficient corresponding to the currently set transmit power X is adjusted to be a pre-distortion coefficient corresponding to (X−N*Δx), where N is the assumed number of decrease times of the transmit power. For example, when the process turns to step S34 from step S33, N=1. Here, it should be noted that in step S34, the pre-distortion coefficient corresponding to (X−N*Δx) is only used as the pre-distortion coefficient corresponding to the transmit power X, to implement adjustment of the pre-distortion coefficient corresponding to the transmit power X, but the set transmit power X is not changed.

Step S35: Analyze a signal received quality report which is obtained according to the pre-distortion coefficient before adjustment and fed back by a receiving end and a signal received quality report which is obtained according to the pre-distortion coefficient after adjustment and fed back by the receiving end.

Step S36: Determine a variation situation of signal received quality of the receiving end. Here, the variation situation of the signal received quality includes that: the signal received quality of the receiving end becomes better, or the signal received quality of the receiving end becomes worse. When the signal received quality becomes better, execute step S37; and when the signal received quality becomes worse, execute step S38.

Step S37: Use the pre-distortion coefficient after adjustment as the pre-distortion coefficient corresponding to the transmit power currently set by the transmitting end, and then return to execute step S34.

Step S38: Use the pre-distortion coefficient before adjustment as the pre-distortion coefficient corresponding to the transmit power currently set by the transmitting end.

In this embodiment, when a pre-distortion coefficient corresponding to a transmit power currently set by a transmitting end is adjusted to be a pre-distortion coefficient corresponding to the transmit power which is increased by one adjustment step, and if received signal quality of a receiving end becomes worse, it indicates that a current actual transmit power is higher than the currently set transmit power. Therefore, it is necessary to adjust the pre-distortion coefficient in the manner of adjusting the pre-distortion coefficient corresponding to the transmit power currently set by the transmitting end to be a pre-distortion coefficient corresponding to the transmit power which is assumed to be decreased by N adjustment steps.

In the foregoing embodiments, the method for adjusting a pre-distortion coefficient according to the embodiments of the present invention has been described in detail. A signal transmitting method according to an embodiment of the present invention will be described hereinafter with reference to FIG. 4. When the signal transmitting method is used to perform pre-distortion processing for a baseband signal, the pre-distortion coefficient obtained through adjustment in the embodiment shown in any one of FIG. 1 to FIG. 3 is adopted.

Figure 4:
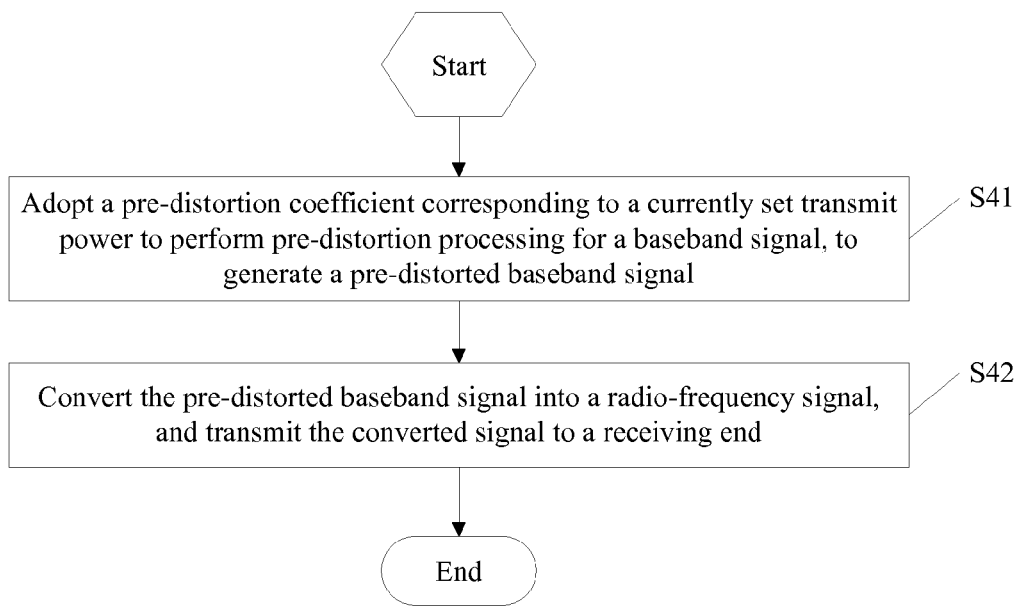
FIG. 4 is a schematic flowchart of a signal transmitting method according to the present invention.

FIG. 4 is a schematic flowchart of a signal transmitting method according to an embodiment of the present invention. The signal transmitting method includes the following steps.

Step S41: Adopt a pre-distortion coefficient corresponding to a transmit power currently set by a transmitting end to perform pre-distortion processing for a baseband signal, to generate a pre-distorted baseband signal.

The pre-distortion coefficient corresponding to the transmit power currently set by the transmitting end is the pre-distortion coefficient obtained through adjustment in the embodiment shown in any one of FIG. 1 to FIG. 3, that is, the pre-distortion coefficient that is adjusted, has a good matching relationship with a current actual transmit power of the transmitting end, and can achieve a good pre-distortion effect.

It is understandable that, in the embodiment shown in any one of FIG. 1 to FIG. 3, if a correspondence between the pre-distortion coefficient and a temperature is further established when the pre-distortion coefficient is determined, the pre-distortion coefficient that matches a current temperature is adopted as the pre-distortion coefficient used in step S41. If there is no pre-distortion coefficient that matches the current temperature under the currently set transmit power, the pre-distortion coefficient may be adjusted under this temperature by using the method for adjusting a pre-distortion coefficient shown in any one of FIG. 1 to FIG. 3, to obtain the pre-distortion coefficient that matches the current temperature; or, a pre-distortion coefficient corresponding to a temperature having a difference value with the current temperature within a certain range may be selected as the pre-distortion coefficient used in step S41. For example, the current temperature is 15°, and the temperature corresponding to the pre-distortion coefficient corresponding to the currently set transmit power is 12°; because a temperature difference of the two is only 3°, the pre-distortion coefficient corresponding to 12° is directly selected to perform pre-distortion processing for the baseband signal, to generate a pre-distorted baseband signal.

Step S42: Convert the pre-distorted baseband signal generated in step S41 into a radio-frequency signal, and transmit the converted signal to a receiving end.

The process of converting the pre-distorted baseband signal into a radio-frequency signal and transmitting the converted signal to a receiving end mainly includes: sequentially performing digital to analog conversion, modulation, up-conversion, filtering, and power amplification by using a power amplifier for the pre-distorted baseband signal, and finally transmitting the processed signal to the receiving end via an antenna.

In this embodiment, during signal transmission, an open-loop pre-distortion coefficient or a closed-loop pre-distortion coefficient is not directly adopted, but a pre-distortion coefficient obtained through adjustment by using the method for adjusting a pre-distortion coefficient shown in any one of FIG. 1 to FIG. 3 is adopted. Therefore, influences of temperature variations and aging of a component (mainly a PA) on a pre-distortion effect can be overcome, and costs can be saved.

In the foregoing embodiments, the method for adjusting a pre-distortion coefficient and the signal transmitting method according to the embodiments of the present invention have been described in detail from with reference to the method procedures. An apparatus for adjusting a pre-distortion coefficient and a transmitter corresponding to the foregoing methods are introduced hereinafter with reference to the accompanying drawings.

Figure 5:
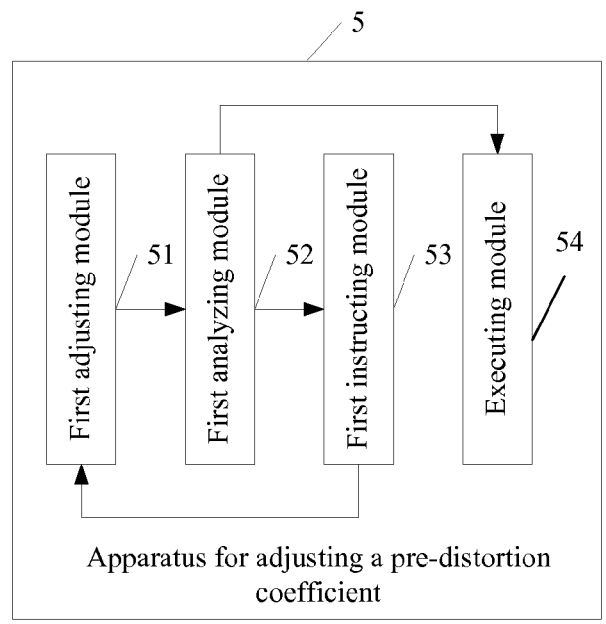
FIG. 5 is a schematic structural diagram of a first embodiment of an apparatus for adjusting a pre-distortion coefficient according to the present invention.

FIG. 5 is a schematic structural diagram of a first embodiment of an apparatus for adjusting a pre-distortion coefficient according to the present invention. An adjusting apparatus 5 includes a first adjusting module 51, a first analyzing module 52, a first instructing module 53, and an executing module 54.

The first adjusting module 51 is configured to adjust a pre-distortion coefficient corresponding to a transmit power currently set by a transmitting end.

Specifically, the adjusting a pre-distortion coefficient corresponding to a transmit power currently set by a transmitting end may include: adjusting the pre-distortion coefficient corresponding to the transmit power currently set by the transmitting end to be a pre-distortion coefficient corresponding to the transmit power which is assumed to be increased by N adjustment steps, where N is the assumed number of increase times of the transmit power; or, adjusting the pre-distortion coefficient corresponding to the transmit power currently set by the transmitting end to be a pre-distortion coefficient corresponding to the transmit power which is assumed to be decreased by N adjustment steps, where N is the assumed number of decrease times of the transmit power. For example, the transmit power currently set by the transmitting end is X and the adjustment step is Δx. Then, during the adjustment, a pre-distortion coefficient corresponding to a transmit power with a value of (X±N*Δx) is used as the pre-distortion coefficient corresponding to the currently set transmit power X, namely, the pre-distortion coefficient after adjustment, where N is the assumed number of increase or decrease times of the transmit power. Here, it should be noted that, although in this embodiment, it is assumed that the transmit power is increased or decreased, the currently set transmit power is not changed in this embodiment.

It should be noted that, because of influences of factors such as temperature variations and aging of a component (mainly a PA), there may be a certain degree of deviation between the transmit power currently set by the transmitting end and a current actual transmit power of the transmitting end.

It is understandable that the pre-distortion coefficient corresponding to the currently set transmit power may be a digital pre-distortion coefficient, and further, an open-loop pre-distortion coefficient.

The first analyzing module 52 is configured to analyze a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end. Here, the variation situation of the signal received quality includes that: the signal received quality of the receiving end becomes better, or the signal received quality of the receiving end becomes worse.

Both the signal received quality report which is obtained according to the pre-distortion coefficient before adjustment and the signal received quality report which is obtained according to the pre-distortion coefficient after adjustment may include a physical quantity for measuring signal received quality of the receiving end, for example, an MSE value or an SNR. A variation situation of the signal received quality of the receiving end may be obtained by comparing the MSE values or SNRs in the signal received quality report obtained in two times. According to the variation situation of signal received quality of the receiving end, it may be determined in a reverse manner, whether a better pre-distortion effect can be achieved by adopting the pre-distortion coefficient before adjustment or the pre-distortion coefficient after adjustment for the transmit power currently set by the transmitting end.

The first instructing module 53 is configured to, when the signal received quality becomes better, use the pre-distortion coefficient after adjustment as the pre-distortion coefficient corresponding to the transmit power currently set by the transmitting end, and then instruct the first adjusting module 51 to continue to adjust the pre-distortion coefficient corresponding to the transmit power currently set by the transmitting end.

The executing module 54 is configured to use the pre-distortion coefficient before adjustment as the pre-distortion coefficient corresponding to the transmit power currently set by the transmitting end.

Further, when using the pre-distortion coefficient before adjustment as the pre-distortion coefficient corresponding to the transmit power currently set by the transmitting end, the executing module 54 establishes a correspondence between a current temperature and the pre-distortion coefficient finally corresponding to the transmit power currently set by the transmitting end. For example, a pre-distortion coefficient LUT (look-up-table) table is established, and a one-to-one correspondence among the transmit power (the set transmit power, which may deviate from an actual transmit power), the pre-distortion coefficient, and the temperature is recorded in the LUT table; or, the one-to-one correspondence among the transmit power, the pre-distortion coefficient, and the temperature may be written into an existing LUT table. By recording the relationship between the pre-distortion coefficient and the temperature, repeated adjustment of the pre-distortion coefficient under a same temperature can be avoided.

It is understandable that conditions for triggering execution of the method for adjusting a pre-distortion coefficient in this embodiment may include the following: A power-on signal is detected. When the power-on signal is detected, a most possible case is that a working environment is changed, and the pre-distortion coefficient is adjusted to adapt to the environmental variation. Alternatively, it is detected that a current environmental temperature is not in a preset temperature range. For example, the preset temperature range is [15°, 30°], but the detected current temperature is 0°. Alternatively, the signal received quality of the receiving end does not meet an expected requirement. In this case, in order to ensure the signal received quality of the receiving end, an attempt may be made to adjust the pre-distortion coefficient corresponding to the currently set transmit power. Alternatively, when a set moment of a timer arrives, for example, the pre-distortion coefficient corresponding to the currently set power may be adjusted seasonally by using the timer. Alternatively, there is another reasonable opportunity.

In this embodiment, a pre-distortion coefficient corresponding to a transmit power currently set by a transmitting end is adjusted, and whether to continue adjustment is determined according to a variation situation of signal received quality of a receiving end before or after the adjustment, so as to find a pre-distortion coefficient which can better match a current actual transmit power as the pre-distortion coefficient corresponding to the transmit power currently set by the transmitting end, thereby overcoming influences of temperature variations (also called "temperature drift") and aging of a component (mainly a PA) on a pre-distortion effect. In addition, because the method for adjusting a pre-distortion coefficient in this embodiment does not need to add a component such as a sampling circuit, a frequency converter, a filter, or an analog to digital converter for implementing a closed-loop pre-distortion coefficient, and can be directly implemented by software, a manufacturing cost can be reduced significantly.

Figure 6:
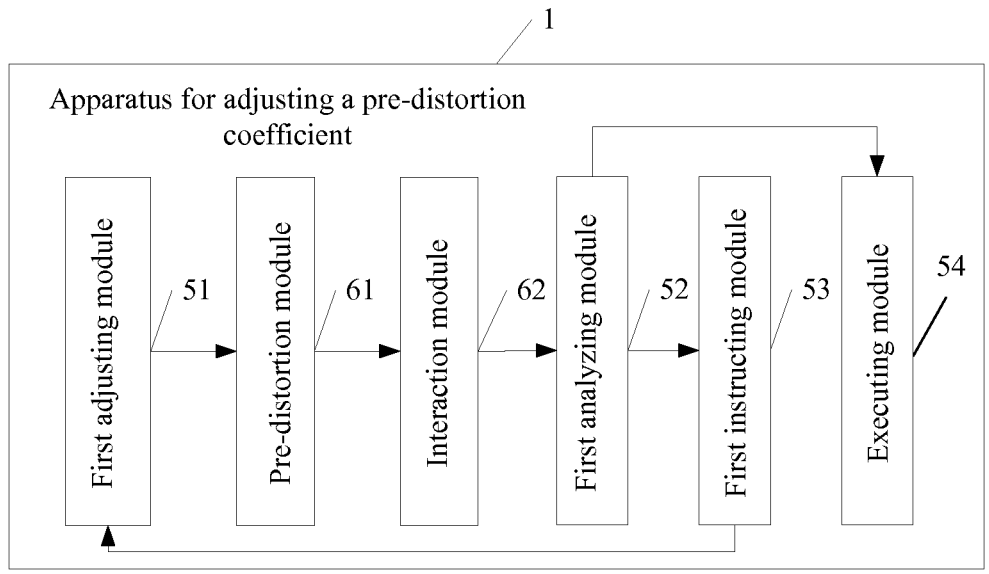
FIG. 6 is a schematic structural diagram of a second embodiment of an apparatus for adjusting a pre-distortion coefficient according to the present invention.

FIG. 6 is a schematic structural diagram of a second embodiment of an apparatus for adjusting a pre-distortion coefficient according to the present invention. Compared with the adjusting apparatus 5 shown in FIG. 5, the adjusting apparatus 5 further includes: a pre-distortion module 61 and an interaction module 62.

The pre-distortion module 61 is configured to perform pre-distortion processing for a baseband signal by using the pre-distortion coefficient before adjustment or after adjustment, to generate a pre-distorted baseband signal.

The interaction module 62 is configured to perform a series of processing (mainly including modulation and up-conversion) for the pre-distorted baseband signal which is generated according to the pre-distortion coefficient before adjustment or after adjustment, transmit the processed signal to the receiving end, and receive the signal received quality report fed back by the receiving end.

An objective of obtaining, according to the pre-distortion coefficient before adjustment or after adjustment, the signal received quality report fed back by the receiving end is achieved by using the pre-distortion module 61 and the interaction module 62, thereby providing a basis for the analyzing module 52 to analyze the variation situation of the signal received quality of the receiving end.

Figure 7:
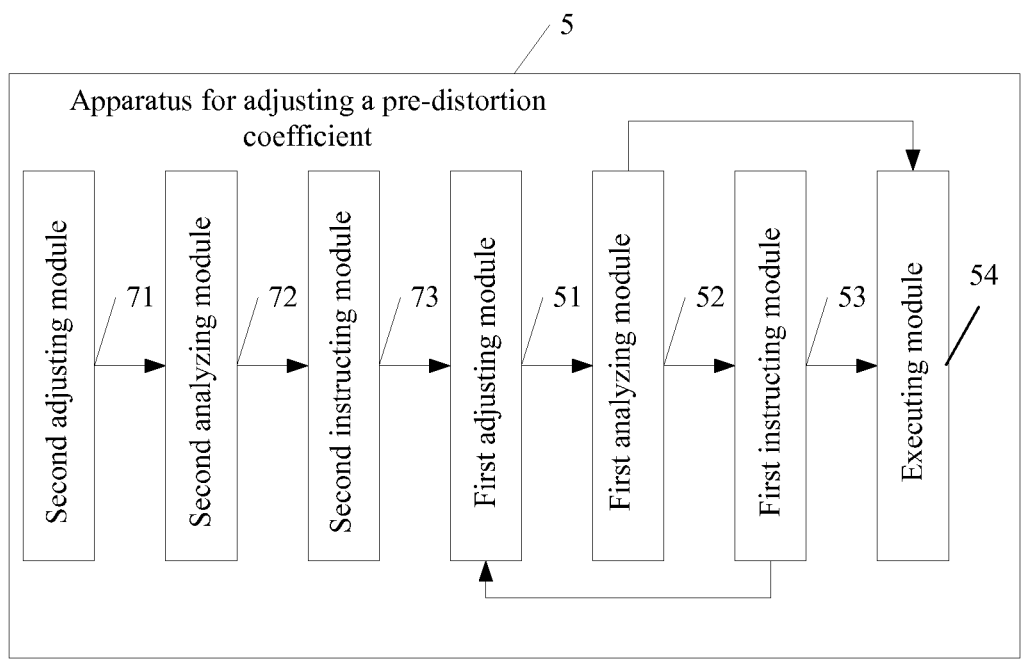
FIG. 7 is a schematic structural diagram of a third embodiment of an apparatus for adjusting a pre-distortion coefficient according to the present invention.

FIG. 7 is a schematic structural diagram of a third embodiment of an apparatus for adjusting a pre-distortion coefficient according to the present invention. The adjusting apparatus 5 includes a second adjusting module 71, a second analyzing module 72, a second instructing module 73, a first adjusting module 51, a first analyzing module 52, a first instructing module 53, and an executing module 54.

The second adjusting module 71 is configured to adjust a pre-distortion coefficient corresponding to a transmit power currently set by a transmitting end to be a pre-distortion coefficient corresponding to the transmit power which is assumed to be decreased by one adjustment step.

Here, it is assumed that the transmit power currently set by the transmitting end is X and the adjustment step is $\Delta x$. Then, the pre-distortion coefficient corresponding to the currently set transmit power X is adjusted to be a pre-distortion coefficient corresponding to $(X-\Delta x)$.

The second analyzing module 72 is configured to analyze a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end.

The second instructing module 73 is configured to: when the second analyzing module 72 analyzes the quality report and obtains a result that the signal received quality of the receiving end becomes worse, use the pre-distortion coefficient before adjustment as the pre-distortion coefficient corresponding to the currently set transmit power, and then instruct the first adjusting module 51 to adjust the pre-distortion coefficient corresponding to the transmit power currently set by the transmitting end to be a pre-distortion coefficient corresponding to the transmit power which is assumed to be increased by one adjustment step.

The first adjusting module 51 is configured to adjust the pre-distortion coefficient corresponding to the transmit power currently set by the transmitting end to be a pre-distortion coefficient corresponding to the transmit power which is assumed to be increased by N adjustment steps.

Here, it is assumed that the transmit power currently set by the transmitting end is X and the adjustment step is $\Delta x$. Then, a pre-distortion coefficient corresponding to the currently set transmit power X is adjusted to be a pre-distortion coefficient corresponding to $(X+N*\Delta x)$, where N is the assumed number of increase times of the transmit power. For example, when the process turns from the instructing module 73 to the first adjusting module 51, N=1. Here, it should be noted that the first adjusting module 51 only adopts the pre-distortion coefficient corresponding to $(X+N*\Delta x)$ as the pre-distortion coefficient corresponding to the transmit power X, to implement adjustment of the pre-distortion coefficient corresponding to the transmit power X, but does not change the set transmit power X.

The first analyzing module 52 is configured to analyze a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end. Here, the variation situation of the signal received quality includes that the signal received quality of the receiving end becomes better, or the signal received quality of the receiving end becomes worse.

The first instructing module 53 is configured to: when the first analyzing module 52 obtains through analysis a result that the signal received quality of the receiving end becomes better, use the pre-distortion coefficient after adjustment as the pre-distortion coefficient corresponding to the transmit power currently set by the transmitting end, and then instruct the first adjusting module 51 to adjust the pre-distortion coefficient corresponding to the transmit power currently set by the transmitting end to be the pre-distortion coefficient corresponding to the transmit power which is assumed to be increased by N adjustment steps.

The executing module 54 uses the pre-distortion coefficient before adjustment as the pre-distortion coefficient corresponding to the transmit power currently set by the transmitting end.

In this embodiment, when a pre-distortion coefficient corresponding to a transmit power currently set by a transmitting end is adjusted to be a pre-distortion coefficient corresponding to the transmit power which is decreased by one adjustment step, and if received signal quality of a receiving end becomes worse, it indicates that a current actual transmit power is higher than the currently set transmit power. Therefore, it is necessary to adjust the pre-distortion coefficient in the manner of adjusting the pre-distortion coefficient corresponding to the transmit power currently set by the transmitting end to be a pre-distortion coefficient corresponding to the transmit power which is increased by N adjustment steps.

Figure 8:
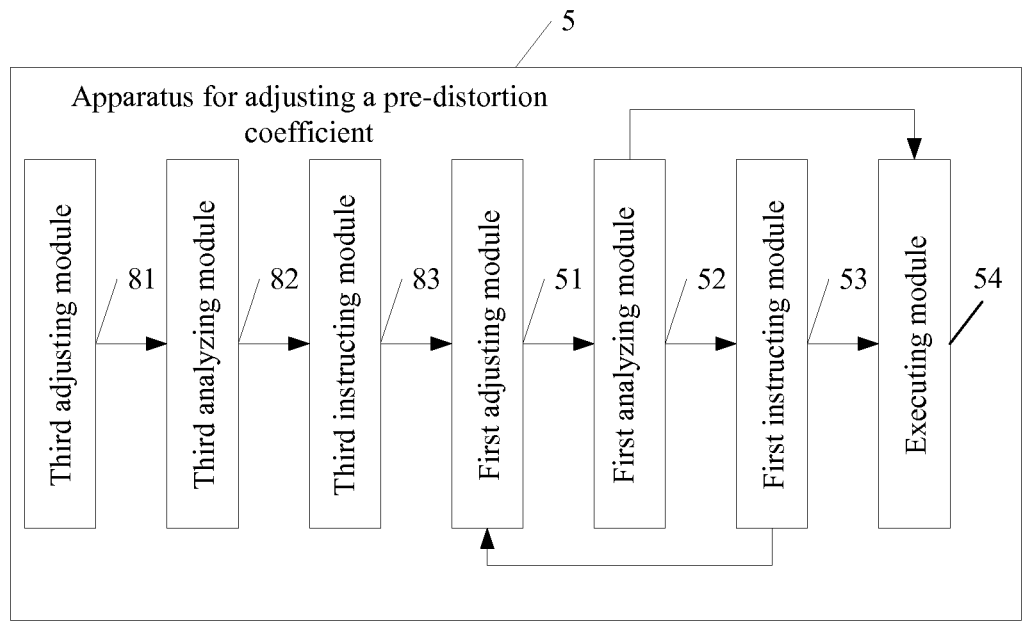
FIG. 8 is a schematic structural diagram of a fourth embodiment of an apparatus for adjusting a pre-distortion coefficient according to the present invention.

FIG. 8 is a schematic structural diagram of a third embodiment of an apparatus for adjusting a pre-distortion coefficient according to the present invention. The adjusting apparatus 5 includes a third adjusting module 81, a third analyzing module 82, a third instructing module 83, a first adjusting module 51, a first analyzing module 52, a first instructing module 53, and an executing module 54.

The third adjusting module 81 is configured to adjust a pre-distortion coefficient corresponding to a currently set transmit power to be a pre-distortion coefficient corresponding to the transmit power which is assumed to be increased by one adjustment step.

Here, it is assumed that the transmit power currently set by the transmitting end is X and the adjustment step is $\Delta x$. Then, the pre-distortion coefficient corresponding to the currently set transmit power X is adjusted to be a pre-distortion coefficient corresponding to $(X+\Delta x)$.

The third analyzing module 82 is configured to analyze a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end. Here, the variation situation of the signal received quality of the receiving end includes: becoming better or becoming worse.

The third instructing module 83 is configured to, when the third analyzing module 54 obtains through analysis a result that the signal received quality of the receiving end becomes worse, instruct the first adjusting module 51 to adjust the pre-distortion coefficient corresponding to the transmit power currently set by the transmitting end to be a pre-distortion coefficient corresponding to the transmit power which is decreased by one adjustment step.

The first adjusting module 51 is configured to adjust the pre-distortion coefficient corresponding to the transmit power currently set by the transmitting end to be a pre-distortion coefficient corresponding to the transmit power which is assumed to be decreased by N adjustment steps.

Here, it is assumed that the transmit power currently set by the transmitting end is X and the adjustment step is $\Delta x$. Then, a pre-distortion coefficient corresponding to the currently set transmit power X is adjusted to be a pre-distortion coefficient corresponding to $(X-N*\Delta x)$, where N is the assumed number of decrease times of the transmit power. For example, when the process turns from the third instructing module 83 to the first adjusting module 51, N=1. Here, it should be noted that the first adjusting module 51 only adopts the pre-distortion coefficient corresponding to $(X-N*\Delta x)$ as the pre-distortion coefficient corresponding to the transmit power X, to implement adjustment of the pre-distortion coefficient corresponding to the transmit power X, but does not change the currently set transmit power X.

The first analyzing module 52 is configured to analyze a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end. Here, the variation situation of the signal received quality includes that: the signal received quality of the receiving end becomes better, or the signal received quality of the receiving end becomes worse.

The first instructing module 53 is configured to: when the first analyzing module 52 determines that the signal received quality of the receiving end becomes better, use the pre-distortion coefficient after adjustment as the pre-distortion coefficient corresponding to the transmit power currently set by the transmitting end, and then instruct the first adjusting module 51 to adjust the pre-distortion coefficient corresponding to the transmit power currently set by the transmitting end to be the pre-distortion coefficient corresponding to the transmit power which is assumed to be decreased by N adjustment steps.

The executing module 54 is configured to: when the first analyzing module 52 determines that the signal received quality of the receiving end becomes worse, use the pre-distortion coefficient before adjustment as the pre-distortion coefficient corresponding to the transmit power currently set by the transmitting end.

In this embodiment, when a pre-distortion coefficient corresponding to a transmit power currently set by a transmitting end is adjusted to be a pre-distortion coefficient corresponding to the transmit power which is increased by one adjustment step, and if received signal quality of a receiving end becomes worse, it indicates that a current actual transmit power is higher than the currently set transmit power. Therefore, it is necessary to adjust the pre-distortion coefficient in the manner of adjusting the pre-distortion coefficient corresponding to the transmit power currently set by the transmitting end to be a pre-distortion coefficient corresponding to the transmit power which is decreased by N adjustment steps.

In the foregoing embodiments, the apparatus for adjusting a pre-distortion coefficient according to the embodiments of the present invention has been described in detail. A transceiver according to an embodiment of the present invention is introduced hereinafter with reference to the accompanying drawings. The transceiver may be integrated with the apparatus for adjusting a pre-distortion coefficient shown in FIG. 5 to FIG. 8, to adjust the pre-distortion coefficient according to signal received quality of a receiving end during signal transmission, thereby overcoming influences of temperature variations and component aging on a pre-distortion effect and saving a manufacturing cost.

Figure 9:
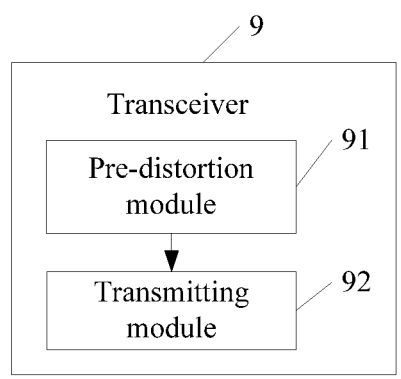
FIG. 9 is a schematic structural diagram of a first embodiment of a transmitter according to the present invention.

FIG. 9 is a schematic structural diagram of a transceiver according to an embodiment of the present invention. As a transmitting end, a transceiver 9 includes a pre-distortion module 91 and a transmitting module 92.

The pre-distortion module 91 is configured to adopt a pre-distortion coefficient corresponding to a transmit power currently set by a transmitting end to perform pre-distortion processing for a baseband signal, to generate a pre-distorted baseband signal.

The pre-distortion coefficient corresponding to the transmit power currently set by the transceiver 9 is the pre-distortion coefficient obtained through adjustment in the embodiment shown in any one of FIG. 5 to FIG. 8, that is, the pre-distortion coefficient that is adjusted, has a good matching relationship with a current actual transmit power of the transceiver 9, and can achieve a good pre-distortion effect.

It is understandable that, in the embodiment shown in any one of FIG. 5 to FIG. 8, if a correspondence between the pre-distortion coefficient and a temperature is established when the pre-distortion coefficient is obtained, the pre-distortion coefficient that matches a current temperature is adopted as the pre-distortion coefficient used by the pre-distortion module 91. If there is no pre-distortion coefficient that matches the current temperature under the currently set transmit power, the pre-distortion coefficient may be adjusted under this temperature by using the apparatus for adjusting a pre-distortion coefficient shown in any one of FIG. 5 to FIG. 8, to obtain the pre-distortion coefficient that matches the current temperature; or, a pre-distortion coefficient corresponding to a temperature having a difference value with the current temperature within a certain range may be selected as the pre-distortion coefficient used by the pre-distortion module 91. For example, the current temperature is 15°, and the temperature corresponding to the pre-distortion coefficient corresponding to the currently set transmit power is 12°; because a temperature difference of the two is only 3°, the pre-distortion coefficient corresponding to 12° is directly selected to perform pre-distortion processing for the baseband signal, to generate a pre-distorted baseband signal.

The transmitting module 92 is configured to convert the pre-distorted baseband signal generated by the pre-distortion module 91 into a radio-frequency signal, and transmit the converted signal to a receiving end.

The process of converting the pre-distorted baseband signal into a radio-frequency signal and transmitting the converted signal to a receiving end mainly includes: sequentially performing digital to analog conversion, modulation, up-conversion, filtering, and power amplification by using a power amplifier for the pre-distorted baseband signal, and finally transmitting the processed signal to the receiving end via an antenna.

In this embodiment, during signal transmission, an open-loop pre-distortion coefficient or a closed-loop pre-distortion coefficient is not directly adopted, but a pre-distortion coefficient obtained through adjustment by using the apparatus for adjusting a pre-distortion coefficient shown in any one of FIG. 5 to FIG. 8 is adopted. Therefore, influences of temperature variations and aging of a component (mainly a PA) on a pre-distortion effect can be overcome, and costs can be saved.

Figure 10:
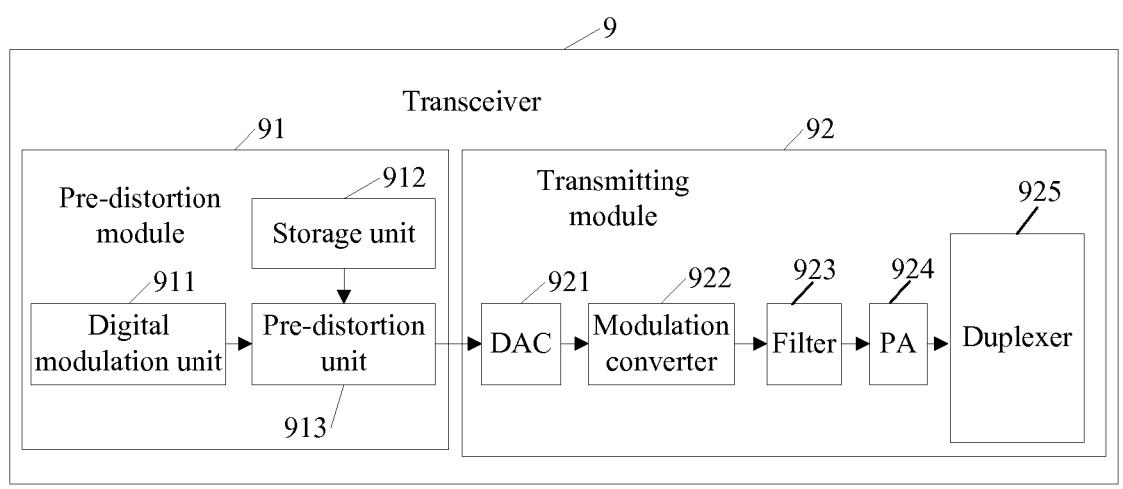
FIG. 10 is a schematic structural diagram of a second embodiment of a transceiver according to the present invention.

FIG. 10 is a schematic structural diagram of a second embodiment of a transceiver according to the present invention. The transceiver 9 in FIG. 10 is a further detailed transceiver 9 in FIG. 9. Specifically, the transceiver 9 includes a pre-distortion module 91 and a transmitting module 92.

The pre-distortion module 91 includes a digital modulation unit 911, a storage unit 912, and a pre-distortion unit 913. The storage unit 912 stores pre-distortion coefficients corresponding to different set powers, where the stored pre-distortion coefficients may be open-loop pre-distortion coefficients, or may be pre-distortion coefficients obtained by adopting the adjusting apparatus shown in any one of FIG. 5 to FIG. 8. When the transceiver 9 needs to transmit a signal, the pre-distortion unit 913 receives a baseband signal transmitted from the digital modulation unit 911, selects from the storage unit 912 a pre-distortion coefficient corresponding to a transmit power currently set by the transceiver 9, performs pre-distortion processing for the baseband signal, to obtain a pre-distorted baseband signal, and outputs the signal to a next stage.

The transmitting module 92 mainly includes a DAC (digital to analog converter) 921, a modulation converter 922, a filter circuit 923, a PA 924, and a duplexer 925. When the pre-distortion unit 913 outputs the pre-distorted baseband signal to the transmitting module 92, the DAC 921, the modulation converter 922, the filter circuit 923, and the PA 924 respectively to perform digital to analog conversion, modulation and up-conversion, filtering, and power amplification for the pre-distorted baseband signal, and finally, the duplexer 925 outputs the processed signal to an antenna to transmit. Here, the duplexer 925 plays a role of distinguishing the signal transmitted by and the signal received by the transceiver 9, to enable the transceiver 9 to implement a function of receiving and transmitting signals.

In the transceiver 9 of this embodiment, because a pre-distortion coefficient obtained by the adjusting apparatus shown in any one of FIG. 5 to FIG. 8 can be adopted, problems can be overcome that a pre-distortion effect is affected by temperature drift and component aging when an open-loop pre-distortion coefficient is adopted, and that a high cost is caused when a closed-loop pre-distortion coefficient is adopted.

A person of ordinary skill in the art may understand that all or a part of the processes of the methods in the embodiments may be implemented by a computer program instructing relevant hardware. The program may be stored in a computer readable storage medium. When the program runs, the processes of the methods in the embodiments are performed. The storage medium may include a magnetic disk, an optical disc, a read-only memory (ROM), or a random access memory (RAM).

The foregoing description merely discloses exemplary embodiments of the present invention and definitely cannot be used to limit the scope of the claims of the present invention, a person of ordinary skill in the art can understand that all or a part of the processes of implementing the foregoing embodiments, and equivalent variations made according to the claims of the present invention still fall within the scope of the present invention.

What is claimed is:

1. A method for adjusting a pre-distortion coefficient, the method comprising:
    adjusting a pre-distortion coefficient corresponding to a transmit power currently set by a transmitting end to be a pre-distortion coefficient corresponding to the transmit power which is assumed to be increased by N adjustment steps, wherein N is an assumed number of increase times of the transmit power;
    analyzing a signal received quality report that is obtained according to the pre-distortion coefficient before adjustment and fed back by a receiving end and a signal received quality report which is obtained according to the pre-distortion coefficient after adjustment and fed back by the receiving end, the analyzing determining whether a signal received quality of the receiving end becomes better or worse;
    if the signal received quality of the receiving end becomes better, using the pre-distortion coefficient after adjustment as the pre-distortion coefficient corresponding to the transmit power currently set by the transmitting end, and then returning to the step of adjusting the pre-distortion coefficient corresponding to a transmit power currently set by a transmitting end; and
    if the signal received quality of the receiving end becomes worse, using the pre-distortion coefficient before adjustment as the pre-distortion coefficient corresponding to the transmit power currently set by the transmitting end;
    wherein, before adjusting the pre-distortion coefficient, the method further comprises:
        adopting the pre-distortion coefficient before adjustment to perform pre-distortion processing for a baseband signal, to generate a pre-distorted baseband signal;
        converting the pre-distorted baseband signal that is generated according to the pre-distortion coefficient after adjustment into a radio-frequency signal;
        transmitting the converted signal to the receiving end; and
        receiving the signal received quality report fed back by the receiving end;
    wherein, after adjusting the pre-distortion coefficient, the method further comprises:
        adopting the pre-distortion coefficient after adjustment to perform pre-distortion processing for the baseband signal, to generate a pre-distorted baseband signal;
        converting the pre-distorted baseband signal that is generated according to the pre-distortion coefficient before adjustment into a radio-frequency signal;
        transmitting the converted signal to the receiving end; and
        receiving the signal received quality report fed back by the receiving end.

2. The method according to claim 1, wherein, when the pre-distortion coefficient before adjustment is used as the pre-distortion coefficient corresponding to the transmit power currently set by the transmitting end, a correspondence is established between a current temperature value and the pre-distortion coefficient corresponding to the transmit power currently set by the transmitting end.

3. The method according to claim 1, wherein, before a step of adjusting the transmit power currently set by the transmitting end to be a pre-distortion coefficient corresponding to the transmit power which is assumed to be increased by one adjustment step, the method further comprises:
    adjusting the pre-distortion coefficient corresponding to the transmit power currently set by the transmitting end to be a pre-distortion coefficient corresponding to the transmit power which is assumed to be decreased by one adjustment step;
    analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and
    if a variation situation is that the signal received quality of the receiving end becomes worse, using the pre-distortion coefficient before adjustment as the pre-distortion coefficient corresponding to the transmit power currently set by the transmitting end, and then instructing to execute the step of adjusting the transmit power currently set by the transmitting end to be the pre-distortion coefficient corresponding to the transmit power which is assumed to be increased by one adjustment step.

4. The method according to claim 1, wherein, before a step of adjusting the pre-distortion coefficient corresponding to the transmit power currently set by the transmitting end to be a pre-distortion coefficient corresponding to the transmit power which is assumed to be decreased by one adjustment step, the method further comprises:
    adjusting the pre-distortion coefficient corresponding to the transmit power currently set by the transmitting end to be a pre-distortion coefficient corresponding to the transmit power which is assumed to be increased by one adjustment step;
    analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and if the signal received quality of the receiving end becomes worse, instructing to execute the step of adjusting the transmit power currently set by the transmitting end to be the pre-distortion coefficient corresponding to the transmit power which is assumed to be decreased by one adjustment step.

5. A method for adjusting a pre-distortion coefficient, the method comprising:
adjusting the pre-distortion coefficient corresponding to a transmit power currently set by a transmitting end to be a pre-distortion coefficient corresponding to a transmit power which is assumed to be decreased by N adjustment steps, wherein N is an assumed number of decrease times of the transmit power;
analyzing a signal received quality report that is obtained according to the pre-distortion coefficient before adjustment and fed back by a receiving end and a signal received quality report which is obtained according to the pre-distortion coefficient after adjustment and fed back by the receiving end, the analyzing determining whether a signal received quality of the receiving end becomes better or worse;
if the signal received quality of the receiving end becomes better, using the pre-distortion coefficient after adjustment as the pre-distortion coefficient corresponding to the transmit power currently set by the transmitting end, and then returning to the step of adjusting the pre-distortion coefficient corresponding to a transmit power currently set by a transmitting end; and
if the signal received quality of the receiving end becomes worse, using the pre-distortion coefficient before adjustment as the pre-distortion coefficient corresponding to the transmit power currently set by the transmitting end;
wherein, before adjusting the pre-distortion coefficient, the method further comprises:
adopting the pre-distortion coefficient before adjustment to perform pre-distortion processing for a baseband signal, to generate a pre-distorted baseband signal;
converting the pre-distorted baseband signal that is generated according to the pre-distortion coefficient after adjustment into a radio-frequency signal;
transmitting the converted signal to the receiving end; and
receiving the signal received quality report fed back by the receiving end; and
wherein after adjusting the pre-distortion coefficient, the method further comprises:
adopting the pre-distortion coefficient after adjustment to perform pre-distortion processing for the baseband signal, to generate a pre-distorted baseband signal;
converting the pre-distorted baseband signal that is generated according to the pre-distortion coefficient before adjustment into a radio-frequency signal;
transmitting the converted signal to the receiving end; and
receiving the signal received quality report fed back by the receiving end.

6. The method according to claim 5, wherein, before a step of adjusting the transmit power currently set by the transmitting end to be a pre-distortion coefficient corresponding to the transmit power which is assumed to be increased by one adjustment step, the method further comprises:

adjusting the pre-distortion coefficient corresponding to the transmit power currently set by the transmitting end to be a pre-distortion coefficient corresponding to the transmit power which is assumed to be decreased by one adjustment step;
analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and
if the variation situation is that the signal received quality of the receiving end becomes worse, using the pre-distortion coefficient before adjustment as the pre-distortion coefficient corresponding to the transmit power currently set by the transmitting end, and then instructing to execute the step of adjusting the transmit power currently set by the transmitting end to be the pre-distortion coefficient corresponding to the transmit power which is assumed to be increased by one adjustment step.

7. The method according to claim 5, wherein, before a step of adjusting the pre-distortion coefficient corresponding to the transmit power currently set by the transmitting end to be a pre-distortion coefficient corresponding to the transmit power which is assumed to be decreased by one adjustment step, the method further comprises:
adjusting the pre-distortion coefficient corresponding to the transmit power currently set by the transmitting end to be a pre-distortion coefficient corresponding to the transmit power which is assumed to be increased by one adjustment step;
analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and
if the signal received quality of the receiving end becomes worse, instructing to execute the step of adjusting the transmit power currently set by the transmitting end to be the pre-distortion coefficient corresponding to the transmit power which is assumed to be decreased by one adjustment step.

8. An apparatus comprising:
a processor; and
a non-transitory computer-readable storage medium storing a program to be executed by the processor, the program including instructions for:
adjusting a pre-distortion coefficient corresponding to a transmit power currently set by a transmitting end to be a pre-distortion coefficient corresponding to the transmit power which is assumed to be increased by N adjustment steps, wherein N is an assumed number of increase times of the transmit power;
analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end;

when the signal received quality of the receiving end becomes better, using the pre-distortion coefficient after adjustment as the pre-distortion coefficient corresponding to the transmit power currently set by the transmitting end, and then repeating the step of adjusting the pre-distortion coefficient corresponding to the transmit power currently set by the transmitting end;

when the received quality of the receiving end becomes worse, using the pre-distortion coefficient before adjustment as the pre-distortion coefficient corresponding to the transmit power currently set by the transmitting end;

adopting the pre-distortion coefficient before adjustment to perform pre-distortion processing for a baseband signal, to generate a pre-distorted baseband signal; and converting the pre-distorted baseband signal which is generated according to the pre-distortion coefficient before adjustment into a radio-frequency signal;

transmitting the converted signal to the receiving end;

receiving the signal received quality report fed back by the receiving end;

adopting the pre-distortion coefficient after adjustment to perform pre-distortion processing for the baseband signal, to generate a pre-distorted baseband signal;

converting the pre-distorted baseband signal which is generated according to the pre-distortion coefficient after adjustment into a radio-frequency signal;

transmitting the converted signal to the receiving end; and receiving the signal received quality report fed back by the receiving end.

9. The apparatus according to claim 8, wherein the program includes further instructions for, when the pre-distortion coefficient before adjustment is used as the pre-distortion coefficient corresponding to the currently set transmit power, establishing a correspondence between a current temperature value and the pre-distortion coefficient corresponding to the transmit power currently set by the transmitting end.

10. An apparatus comprising:
a processor; and
a non-transitory computer-readable storage medium storing a program to be executed by the processor, the program including instructions for:
adjusting a pre-distortion coefficient corresponding to a transmit power currently set by a transmitting end to be a pre-distortion coefficient corresponding to the transmit power which is assumed to be decreased by N adjustment steps, wherein N is a number of decrease times of the transmit power;
analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end;
when the signal received quality of the receiving end becomes better, using the pre-distortion coefficient after adjustment as the pre-distortion coefficient corresponding to the transmit power currently set by the transmitting end, and then repeating the adjusting continue to adjust the pre-distortion coefficient corresponding to the transmit power currently set by the transmitting end; and when the received quality of the receiving end becomes worse, using the pre-distortion coefficient before adjustment as the pre-distortion coefficient corresponding to the transmit power currently set by the transmitting end;

adopting the pre-distortion coefficient before adjustment to perform pre-distortion processing for a baseband signal, to generate a pre-distorted baseband signal;

converting the pre-distorted baseband signal which is generated according to the pre-distortion coefficient before adjustment into a radio-frequency signal;

transmitting the converted signal to the receiving end;

receiving the signal received quality report fed back by the receiving end;

adopting the pre-distortion coefficient after adjustment to perform pre-distortion processing for the baseband signal, to generate a pre-distorted baseband signal;

converting the pre-distorted baseband signal which is generated according to the pre-distortion coefficient after adjustment into a radio-frequency signal;

transmitting the converted signal to the receiving end; and receiving the signal received quality report fed back by the receiving end.

11. The apparatus according to claim 8, wherein the program includes further instructions for:
adjusting module the pre-distortion coefficient corresponding to the transmit power currently set by the transmitting end to be a pre-distortion coefficient corresponding to the transmit power which is decreased by one adjustment step;

analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and when the variation situation is that the signal received quality of the receiving end becomes worse, using the pre-distortion coefficient before adjustment as the pre-distortion coefficient corresponding to the transmit power currently set by the transmitting end, and then repeating the adjusting to adjust the transmit power currently set by the transmitting end to be a pre-distortion coefficient corresponding to the transmit power which is assumed to be increased by one adjustment step.

12. The apparatus according to claim 8, wherein the program includes further instructions for:
adjusting the pre-distortion coefficient corresponding to the transmit power currently set by the transmitting end to be a pre-distortion coefficient corresponding to the transmit power which is decreased by one adjustment step;

analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and when the signal received quality of the receiving end becomes worse, using the pre-distortion coefficient before adjustment as the pre-distortion coefficient corresponding to the currently set transmit power, and then repeating adjustment of the transmit power currently set by the transmitting end to be a pre-distortion coefficient corresponding to the transmit power which is assumed to be increased by one adjustment step.

13. The method according to claim 5, wherein, when the pre-distortion coefficient before adjustment is used as the pre-distortion coefficient corresponding to the transmit power currently set by the transmitting end, a correspondence is established between a current temperature value and the pre-distortion coefficient corresponding to the transmit power currently set by the transmitting end.

14. The apparatus according to claim 10, wherein the program includes instructions for, when the pre-distortion coefficient before adjustment is used as the pre-distortion coefficient corresponding to the currently set transmit power, establishing a correspondence between a current temperature value and the pre-distortion coefficient corresponding to the transmit power currently set by the transmitting end.

15. The apparatus according to claim 10, wherein the program includes instructions for:
  adjusting the pre-distortion coefficient corresponding to the transmit power currently set by the transmitting end to be a pre-distortion coefficient corresponding to the transmit power which is decreased by one adjustment step;
  analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and
  when the variation situation is that the signal received quality of the receiving end becomes worse, using the pre-distortion coefficient before adjustment as the pre-distortion coefficient corresponding to the transmit power currently set by the transmitting end, and then repeating the adjusting to adjust the transmit power currently set by the transmitting end to be a pre-distortion coefficient corresponding to the transmit power which is assumed to be increased by one adjustment step.

16. The apparatus according to claim 10, wherein the program includes instructions for:
  adjusting the pre-distortion coefficient corresponding to the transmit power currently set by the transmitting end to be a pre-distortion coefficient corresponding to the transmit power which is decreased by one adjustment step;
  analyzing a signal received quality report which is obtained according to the pre-distortion coefficient before adjustment and fed back by a receiving end and a signal received quality report which is obtained according to the pre-distortion coefficient after adjustment and fed back by the receiving end, to determine a variation situation of signal received quality of the receiving end; and
  when the signal received quality of the receiving end becomes worse, using the pre-distortion coefficient before adjustment as the pre-distortion coefficient corresponding to the currently set transmit power, and then repeating the adjusting to adjust the transmit power currently set by the transmitting end to be a pre-distortion coefficient corresponding to the transmit power which is assumed to be increased by one adjustment step.

* * * * *